United States Patent [19]

Gariazzo

[11] 4,246,571
[45] Jan. 20, 1981

[54] HIGH RESOLUTION QUANTIZER

[75] Inventor: Michael C. Gariazzo, Bowie, Md.

[73] Assignee: The United States of America as represented by the Secretary of the Navy, Washington, D.C.

[21] Appl. No.: 889,576

[22] Filed: Mar. 23, 1978

[51] Int. Cl.² ............................................ H03K 13/02
[52] U.S. Cl. ............................................ 340/347 AD
[58] Field of Search .............. 325/38 B; 340/347 AD, 340/347 M

[56] References Cited

U.S. PATENT DOCUMENTS

| | | | |
|---|---|---|---|
| 3,458,721 | 7/1969 | Maynard | 340/347 AD |
| 3,501,625 | 3/1970 | Gorbatenko | 340/347 AD |
| 3,521,269 | 7/1970 | Brooks | 340/347 AD |
| 3,581,304 | 5/1971 | Paradise | 340/347 AD |
| 3,646,586 | 2/1972 | Kurz | 340/347 AD |
| 3,653,037 | 3/1972 | Utley | 340/347 AD |
| 3,689,840 | 9/1972 | Brown | 325/38 B |
| 4,021,799 | 5/1977 | Hinosaita | 325/38 B |
| 4,032,797 | 6/1977 | Metcalf | 340/347 AD |

Primary Examiner—Charles D. Miller
Attorney, Agent, or Firm—R. S. Sciascia; A. L. Branning; D. A. Lashmit

[57] ABSTRACT

A system for digitally quantizing, at high resolution, relatively small variations of an analog input signal. Initially, a reference level signal having a preselected value close to the average magnitude of the analog signal being quantized is compared with the analog input signal. The difference between these two signals is amplified and then analog to digital converted. By an iterative process, the reference level is adjusted as necessary to closely track the gross magnitude level of the analog input signal. Analog to digital conversion is applied only to the small difference signal, thereby allowing quantization to occur with high resolution. The system automatically keeps track of gross signal excursions so that the magnitude of the quantized signals is also available to the user.

2 Claims, 3 Drawing Figures

HIGH RESOLUTION QUANTIZER

BACKGROUND OF THE INVENTION

This invention relates generally to analog to digital conversion and more specifically to the high resolution digital quantization of relatively small changes of an analog signal.

Systems currently in use perform high resolution digital quantization by a variety of methods including: (1) employing resettable threshold detectors which provide an asynchronous output and usually supply no information concerning the absolute magnitude of the signal being quantized, and (2) performing analog to digital conversion at high enough accuracy levels to detect relatively small changes in the analog input signal being quantized. This precise analog to digital conversion requires the use of extremely precise, stable, high power, and expensive devices.

SUMMARY OF THE INVENTION

Accordingly, the present invention provides a high resolution digital quantizer capable of detecting relatively small changes of an analog input signal. Conversion is accomplished by an iterative process that allows the use of analog to digital converters that are less precise and stable than those that would be required if quantization were performed according to current methods and without using the quantizing system according to the present invention.

A differential amplifier compares the analog input signal with a reference level signal. The resulting difference signal is amplified and then analog to digital converted. The digital deviation signal from this conversion is compared with a preselected threshold. If this threshold is exceeded, the reference signal is modified to more closely approximate the level of the analog input signal. The differential amplifier compares the analog input signal with this reference level signal as modified and digital conversion takes place again. This process continues with the reference level signal modified as required during successive iterations.

OBJECTS OF THE INVENTION

It is therefore an object of the present invention to provide an analog to digital conversion system capable of accurately quantizing small changes in the amplitude of an analog signal.

Another object of the present invention is to provide an analog to digital conversion system that will examine an analog input signal, establish a reference level for that signal and digitally quantize deviations from that reference level.

A further object of the present invention is to provide an analog to digital conversion system that will update its reference level as necessary automatically.

BRIEF DESCRIPTION OF THE DRAWINGS

Other objects and many of the attendant advantages of the present invention will be readily apparent as the invention becomes better understood by reference to the following detailed description with the appended claims, when considered in conjunction with the accompanying drawings, wherein:

DESCRIPTION OF THE PREFERRED EMBODIMENT

Figure 1:
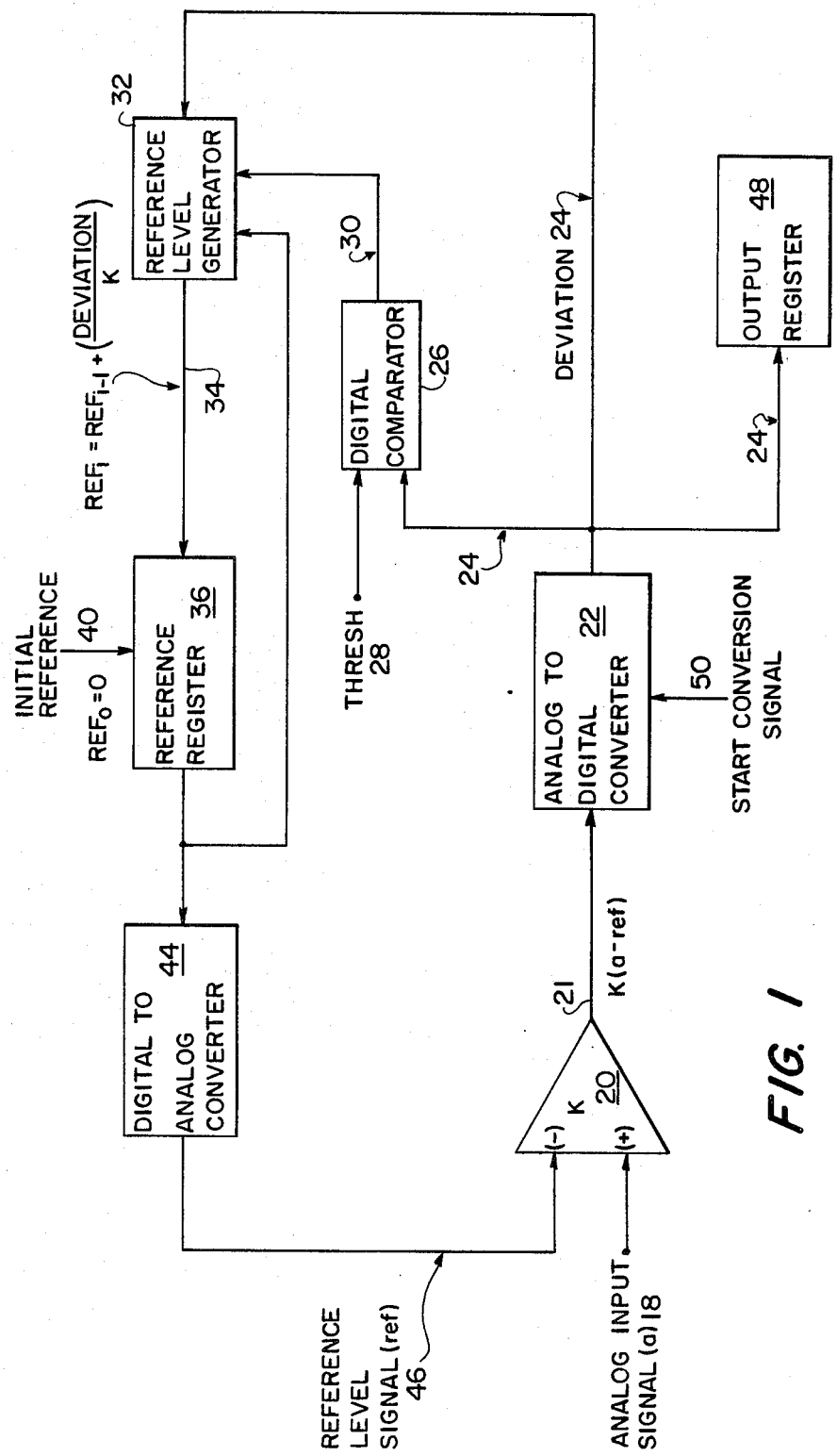
FIG. 1 is a functional block diagram of the high resolution quantizer according to the present invention.

FIG. 1 is a functional block diagram of the high resolution quantizer according to the present invention. As stated previously, the object of this system is to quantize deviations in an analog input signal (a) 18 and to present the quantized deviations in digital format. Rather than performing analog to digital conversion directly upon input signal (a) 18, as in conventional systems, a reference level signal (ref) 46 is established and analog to digital conversion is accomplished upon an amplified difference signal 21 between analog input signal (a) 18 and reference level signal (ref) 46. Whenever amplified difference signal 21 exceeds a threshold level 28 that is externally preset, the magnitude of reference level signal (ref) 46 is modified to more closely approximate the value of analog input signal (a) 18. The magnitude of reference level signal (ref) 46 is available so that the user can be constantly aware of gross signal excursions as well as minute quantized differences.

Analog input signal (a) 18 is coupled to the non-inverting input of a differential amplifier 20 having gain K. Reference level signal (ref) 46 is coupled to the inverting input of amplifier 20. The resulting amplified difference signal 21 appearing at the output of amplifier 20 is equal to K (a-ref). Amplified difference signal 21 is coupled to a conventional analog to digital converter 22. The analog to digital conversion process is initiated by a "start conversion" signal 50, externally generated, applied to analog to digital converter 22. Analog to digital converter 22 produces a DEVIATION signal 24 which is the digital equivalent of amplified difference signal 21. DEVIATION signal 24 is coupled to an output register 48, a digital comparator 26 and a reference level generator 32. Register 48 continuously provides the user with the digitally quantized equivalent of amplified difference signal 21. By digitally converting only amplified difference signal 21, the full resolution capabilities of converter 22 are applied to a small difference signal 21 rather than directly to analog input signal (a) 18, thereby allowing a high degree of resolution to take place. By keeping track of the magnitude of reference level signal 46, the user can keep track of gross excursions of analog input signal (a) 18.

Digital comparator 26 compares DEVIATION signal 24 with a preselected digital threshold level (THRESH) 28, and generates at its output a "high" level logic signal 30 whenever the absolute value of DEVIATION signal 24 exceeds digital threshold level (THRESH) 28. This logic output signal 30 from digital comparator 26 is known as the reference update instruction because it instructs reference level generator 32 to begin a process which ultimately modifies reference level signal (ref) 46. This modification can be either an increase or decrease in magnitude based upon a predetermined formula. This predetermined formula, part of the iterative process, allows reference level signal (ref) 46 to track the level of analog input signal (a) 18 so that amplified difference signal 21 will never get so large as to cause saturation of the amplifier. In this manner, analog to digital conversion is accomplished only upon the amplified difference signal 21 between analog input signal (a) 18 and reference level signal (ref) 46, thereby allowing analog to digital conversion to take place with a high degree of resolution.

Reference update instruction 30 is coupled to reference level generator 32 as a control input commanding the calculation of a digital reference level (REF) signal 34. Digital reference level signals (REF) 34 calculated and produced by reference level generator 32 are coupled to a reference register 36 which stores the value of this reference signal until it is updated. Reference register 36 is initialized by an external initial reference signal 40. This initial reference signal 40 defines the initial value of (REF) 34. The output of reference register 36 is a digital signal equal to the value of digital reference level signal (REF) 34 and is coupled to the input of a digital to analog converter 44 and is also fed back to reference level generator 32. Digital to analog converter 44 converts the value of digital reference level signal (REF) 34 to its analog equivalent. This analog equivalent is the reference level signal (ref) 46 and is coupled the the inverting input of amplifier 20.

Upon receipt of a reference update instruction 30, reference level generator 32 calculates and produces a new digital reference level signal REF equal to the previous value of REF plus (DEVIATION/ K). This new value of REF is immediately transferred to reference register 36 which in turn provides input for digital to analog converter 44 so that converter 44 can provide a new reference level signal (ref) 46 to amplifier 20. Reference register 36 always has stored within it the digital equivalent of the current value of reference level signal 21.

After a certain time period has elapsed, analog to digital conversion in converter 22 gain takes place, this time with an updated reference signal 46. The process of updating the reference signal 46 continues along as necessary.

Figure 2:
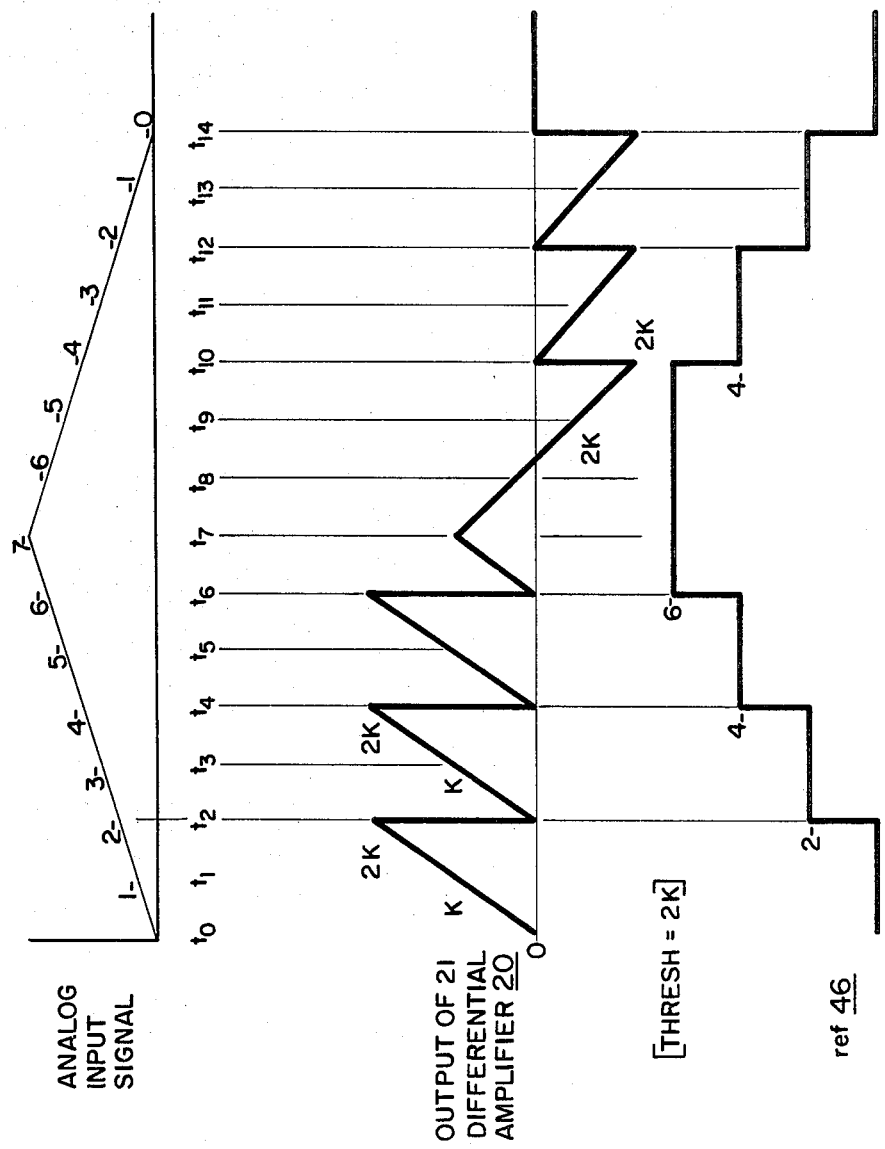
FIG. 2 is a waveform diagram illustrating the action of the high resolution quantizer on a hypothetical analog input signal having a triangular shape.

The system is more clearly understood with reference to FIG. 2 which is a waveform diagram illustrating the action of the high resolution quantizer according to the present invention on a hypothetical analog input signal having a triangular shape. At time $t_0$ the value of analog input signal 18 is zero. The value of signal 18 rises linearly up to a peak value of 7 at time $t_7$. At $t_7$ the value of signal 18 begins to fall and falls linearly back to value zero at $t_{14}$. The center waveform diagram of FIG. 2 is the output 21 of differential amplifier 20. The value of this signal will always be equal to K (a - ref). The bottom wave-form of FIG. 2 is the value of (ref) 46. As the value of analog input signal 18 rises from $t_0$ to $t_2$ and reaches a value of 2, the output 21 of differential amplifier 20 rises linearly from 0 to a value of 2K. For the purposes of illustration only, we assume a preselected threshold value equal to 2K. When analog input signal 18 reaches a value of 2 at $t_2$, the output 21 of differential amplifier 20 reaches 2K and the digital equivalent of 2K, the output 24 of analog of digital converter 22, is compared with preselected threshold 28 in digital comparator 26. Since DEVIATION 24, the digital equivalent of differential amplifier output 21, exceeds the preselected threshold, comparator 26 generates a reference update instruction 30 requiring reference level generator 32 to calculate and produce a new digital reference level signal (REF) 34. In this example, the new reference is incremented by a value equal to DEVIATION 24 divided by K. In this case DEVIATION 24 divided by K is equal to 2 and after digital to analog conversion in converter 44, ref 46 takes on a value of 2 at time $t_2$ as shown. With ref 46 now equal to a value of 2, output 21 of differential amplifier 20 again linearly rises between $t_2$ to $t_4$. At $t_4$, the preselected threshold 28 is again exceeded and a new reference incremented by a value of 2 is stored in reference register 36. After digital to analog conversion in converter 44, ref 46 is established at a value of 4 and the process continues. A similar change in ref 46 occurs at time $t_6$. From time $t_6$ to time $t_{10}$, as the value of analog input signal 18 rises from a value of 6 to a peak value of 7 and then falls linearly to a value of 4 at time $t_{10}$, the preselected threshold 28 is not exceeded and the value of ref is not changed. During this time period, the output of differential amplifier 20 rises from a value of zero at time $t_6$ to a value of K at $t_7$ and then falls linearly to a value of $-2K$ at time $t_{10}$. At time $t_{10}$ when the output 21 of differential amplifier 20 reaches a value of $-2K$, preselected threshold 28 is again exceeded and a reference update signal 30 adjusts ref 46 down to a value of 4. This adjustment downward of ref 46 causes the output of differential amplifier 20 to reach zero momentarily. As the value of analog input signal 18 continues to fall after time $t_{10}$, a second adjustment in ref 46 is indicated at time $t_{12}$ and again at time $t_{14}$.

At intervals during this process from $t_0$ to $t_{14}$, according to the frequency of start conversion signal 50, analog to digital converter 22 converts amplified difference signal 21 to its digital equivalent DEVIATION 24, and transfers DEVIATION to output register 48. Register 48 provides continuous access to the user of the digitally quantized difference between the value of analog input signal (a) 18 and reference level signal (ref) 46. By devoting the entire capacity of analog to digital converter 22 to quantizing this difference, and by keeping track of reference level 46 by noting the contents of reference register 36, the user has available a highly resolved digitally quantized display of analog input 18.

Figure 3:
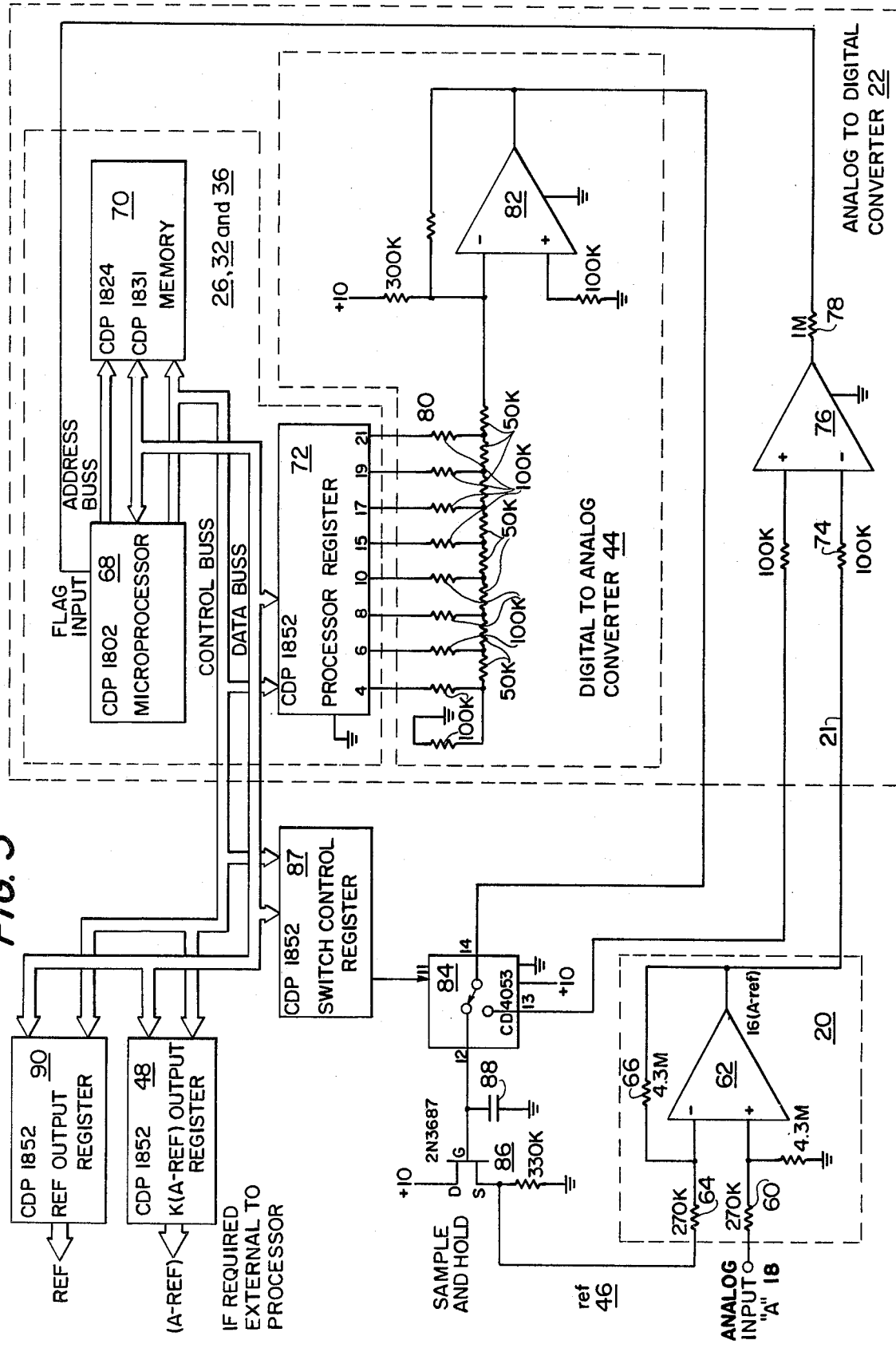
FIG. 3 is a schematic diagram of the preferred embodiment of the high resolution quantizer according to the present invention.

FIG. 3 is schematic diagram of the high resolution quantizer as actually built and used in the preferred embodiment. Many of the circuit functions are built around a microprocessor and its associated memories and registers for convenience. In addition, several circuits perform multiple functions to promote cost efficiency. Analog input signal 18 is applied to the positive input of differential amplifier 20 by coupling it through a resistive divider 60 to the positive input port of an operational amplifier 62. Reference signal 46 is applied to the inverting input of operational amplifier 62 through a resistor 64. A feedback resistor 66 from the output of amplifier 62 to its inverting input in conjunction with resistor 64 and resistive divider 60 determine the gain of differential amplifier 20. The function of analog to digital converter 22 is accomplished by a microprocessor 68 working in conjunction with its memory 70 and processor register 72. Output signal 21 from differential amplifier 20 is coupled through an input resistor 74 to a differential amplifier 76. The output of amplifier 76 is coupled through a resistor 78 to the flag input of microprocessor 68. In addition to the digital equivalent of signal 21 being stored within the microprocessor's functional register 72, this information is also coupled to output register 48 for display to the user. The function of digital comparator 26, operating on digital deviation 24 and the externally preselected threshold 28 is accomplished by microprocessor 68 in conjunction with its memory 70 and processor register 72. Dotted lines around the various components of FIG. 3 indicate the functional areas shown on the block diagram of FIG. 1. When a reference update instruction 30 indicates that a new reference level is to be generated, microprocessor 68 generates this reference signal and automatically stores it in its processor register 72. In order to make use of this signal, it is necessary that it be converted to analog form by a digital to analog converter 44. To accomplish this conversion, processor register 72 is coupled to a resistor network 80 which is in turn coupled to a differential amplifier 82. The resulting analog signal is coupled to the toggle of a electronic switch 84. After each reference update, this switch, controlled by a switch control register 87, applies the analog reference signal from amplifier 82 to a sample and hold circuit 86. Sample and hold circuit 86 is essentially an FET device having a capacitor 88 coupled from its gate to ground. The high resistance of the gate-source junction maintains the charge on capacitor 88 until such time as it is reset by switch 84. Reference signal 46 is taken from the source of FET sample and hold circuit 86 and is coupled to differential amplifier 20. After a charge representing the proper analog reference has been stored on capacitor 88, a switch control register 87 switches the toggle and its analog level to the noninverting input of amplifier 76 for the remainder of the conversion cycle. Each time it is necessary to update the reference level, switch 84 toggles the output of amplifier 82 to sample and hold circuit 86 so that differential amplifier 20 will have access to the new reference value for comparison purposes. Sample and hold circuit 86, switch 84, and switch control register 87 are made necessary only because the microprocessor and its associated memory and register are used for multiple purposes. Because the information in processor register 72 is constantly changing, the analog reference value 46 would not be continuously available as an input to differential amplifier 20 without this "extra" circuitry.

Of course, if functional block diagram FIG. 1 is implemented by discrete components instead of by use of a microprocessor, sample and hold circuit 86, switch 84, and switch control register 86 would not be necessary.

In addition, a reference register 90 coupled to microprocessor 68 provides a digital equivalent for the reference value and is available to the user at all times.

Therefore, it is apparent that there has been provided an analog to digital conversion system for quantizing with high resolution, small changes in an analog input signal. By the use of an iterative system, the full capacity of an analog to digital converter can be applied to a relatively small change in input signal level.

Obviously, other embodiments and modifications of the present invention will readily come to those of ordinary skill in the art having the benefit of the teachings presented in the foregoing description and the drawings. It is, therefore, to be understood that this invention is not to be limited thereto and that said modifications and embodiments are intended to be included within the scope of the appended claims.

What is claimed and desired to be secured by Letters Patent of the United States is:

1. An analog to digital conversion system for quantizing in digital form changes that occur in an analog input signal comprising:
    means for establishing in both analog and digital form a reference level signal related to the magnitude of said analog input signal;
    a differential amplifier having a gain greater than one for comparing said analog input signal with said reference level signal, whereby an amplified difference signal proportional to and greater than the difference between said analog input signal and said reference level signal is produced;
    an analog to digital converter coupled to the output of said differential amplifier whereby a digital deviation signal equivalent to said amplified difference signal is generated;
    a digital comparator coupled to the output of said analog to digital converter and to an external source for providing a threshold level signal, for generating a reference update instruction whenever the magnitude of said digital deviation signal exceeds said threshold level;
    means coupled to said digital comparator and to said analog to digital converter for generating a modified reference level signal in digital form in response to said reference update instruction; and
    a digital to analog converter coupled to said modified reference level signal generator for converting said digital form modified reference level signal into analog form wherein said analog form modified reference level signal is coupled to said differential amplifier.

2. A method for quantizing in digital form changes that occur in an analog input signal comprising the steps of:
    establishing in both analog and digital form a reference level signal related to the magnitude of said analog input signal;
    comparing said analog input signal with said reference level signal, whereby an amplified difference signal proportional to and greater than the difference between said analog input signal and said reference signal is produced;
    converting said difference signal into digital form to produce a digital deviation signal;
    comparing said digital deviation signal with an externally generated threshold level;
    generating a reference update instruction whenever the magnitude of said digital deviation signal exceeds said threshold level signal;
    generating a modified reference level signal in digital form in response to said reference update instruction; and
    converting said digital form modified reference level signal into analog form.

* * * * *